United States Patent [19]
Fukase

[11] Patent Number: 5,656,529
[45] Date of Patent: Aug. 12, 1997

[54] METHOD FOR MANUFACTURING HIGHLY-INTEGRATED CAPACITOR

[75] Inventor: Tadashi Fukase, Tokyo, Japan

[73] Assignee: NEC Corporation, Tokyo, Japan

[21] Appl. No.: 644,244

[22] Filed: May 10, 1996

[30]     Foreign Application Priority Data

May 11, 1995   [JP]   Japan ................... 7-135604

[51] Int. Cl.⁶ .................................. H01L 21/70
[52] U.S. Cl. ........................... 438/398; 438/964
[58] Field of Search ................ 437/52, 192, 200, 437/919; 257/303, 306

[56]            References Cited
           U.S. PATENT DOCUMENTS

| 5,466,629 | 11/1995 | Mihara et al. | 437/60 |
| 5,470,775 | 11/1995 | Nariani | 437/52 |
| 5,554,558 | 9/1996 | Hsu et al. | 437/60 |

FOREIGN PATENT DOCUMENTS

| 3139882 | 6/1991 | Japan . |
| 4152668 | 5/1992 | Japan . |

OTHER PUBLICATIONS

H. Watanabe et al.; "A New Cylindrical Capacitor Using Hemispherical Grained Si (HSG-Si) for 256Mb DRAMs"; IEDM 92, (1992), pp. 259–262.

S.P. Sim et al.; "A New Stacked SMVP (Surrounded Micro Villus Patterning) Cell for 256 Mega and 1 Giga bit DRAMs"; International Conference on Solid State Devices and Materials (1993), pp. 886–888.

S. Yu et al.; "The Honeycomb–Shape Capacitor Structure for ULSI DRAM"; IEEE Electron Device Letters, vol. 14, No. 8, Aug. 1993, pp. 369–371.

Primary Examiner—John Niebling
Assistant Examiner—Joni Y. Chang
Attorney, Agent, or Firm—Whitham, Curtis, Whitham & McGinn

[57]            ABSTRACT

In a method for manufacturing a capacitor, a lower electrode is formed by an amorphous refractory metal silicide layer and its underlying conductive layer, a heating operation is performed upon the amorphous refractory metal silicide layer, so that the amorphous refractory metal silicide layer is converted into a polycrystalline refractory metal layer having an uneven surface.

12 Claims, 13 Drawing Sheets

METHOD FOR MANUFACTURING HIGHLY-INTEGRATED CAPACITOR

BACKGROUND OF THE INVENTION

1. Field of the Invention

The present invention relates to a method for manufacturing a capacitor used as a stacked capacitor in a memory cell of a dynamic random access memory (DRAM) device.

2. Description of the Related Art

Generally, in a DRAM cell, a stacked capacitor is comprised of a lower electrode layer, an upper electrode layer, and a dielectric layer therebetween. Recently, in order to increase the capacity of the stacked capacitor, various approaches have been known to make the surface of the lower electrode layer uneven.

In a first prior art method for manufacturing a stacked capacitor, a contact hole is perforated in an insulating layer on a silicon substrate. Then, a tungsten silicide layer is buried in the contact hole, and a polycrystalline silicon layer is formed thereon. Then, the polycrystalline silicon layer is etched by a wet etching process using hot phosphoric acid, to make the surface of the polycrystalline silicon layer uneven. Then, the polycrystalline silicon layer and the tungsten silicide layer are patterned to form a lower electrode (see: JP-A-139882). This will be explained later in detail.

In the first prior art manufacturing method, however, since the height of the polycrystalline silicon layer is reduced by etching with hot phosphoric acid, the increase of the capacity of the stacked capacitor is reduced, and also, the capacity of the stacked capacitor fluctuates greatly. Also, in order to avoid disconnection of the polycrystalline silicon layer, the tungsten silicide layer is required. However, since the contact hole coverage characteristics of the tungsten silicide layer is deteriorated as compared with polycrystalline silicon, the device is not adapted to a fine structure where the contact hole is small in radius and large in height.

In a second prior art method for manufacturing a stacked capacitor, a contact hole is perforated in an insulating layer on a silicon substrate. Then, an amorphous silicon layer is buried in the contact hole. Then, a seeding operation is performed upon the amorphous silicon layer, so that polycrystalline silicon is grown in the amorphus silicon layer, and thus, a hemispherical-grain (HSG) polycrystalline silicon layer is formed thereon. Then, the HSG polycrystalline silicon layer and the amorphous silicon layer are patterned to form a lower electrode (see: H. Watanabe et al., "A New Cylindrical Capacitor Using Hemispherical Grained Si (HSG-Si) for 256 Mb DRAMs", IEDM 92, pp. 259–262, 1992). This also will be explained later in detail.

In the second prior art method, however, a seeding apparatus with an ultra-high vacuum chamber is required which increases the manufacturing cost. Also, it is necessary to monitor a natural oxide layer on the amorphous silicon layer, which also increases the manufacturing cost.

In a third prior art method for manufacturing a capacitor, a polycrystalline silicon layer and a tungsten silicide layer are formed on a first insulating layer, and a heating operation is performed upon the tungsten silicide layer in an oxygen atmosphere to make the surface of the tungsten silicide layer uneven. The uneven tungsten silicide layer and the polycrystalline silicon layer are patterned to form word lines. Then, a second insulating layer and a lower electrode layer are formed. In this case, the second insulating layer is so thin that the uneven surfaces of the word lines are transferred to the lower electrode layer. Thus, the surface of the lower electrode is made uneven (see: JP-A-4-152668). This also will be explained later in detail.

In the third prior art manufacturing method, however, since the second insulating layer is very thin, it is impossible to flatten the second insulating layer, thus inviting disconnection of the layers over the second insulating layer. Also, when the tungsten silicide layer is oxidized, tungsten may be peeled off from the tungsten silicide layer.

SUMMARY OF THE INVENTION

It is an object of the present invention to provide a method for manufacturing a highly-integrated capacitor at a low manufacturing cost.

According to the present invention, in a method for manufacturing a capacitor, a lower electrode is formed by an amorphous refractory metal silicide layer and its underlying conductive layer, and a heating operation is performed upon the amorphous refractory metal silicide layer, so that the amorphous refractory metal silicide layer is converted into a polycrystalline refractory metal layer having an uneven surface.

BRIEF DESCRIPTION OF THE DRAWINGS

The present invention will be more clearly understood from the description as set forth below. as compared with the prior art, with reference to the accompanying drawings, wherein.

DESCRIPTION OF THE PREFERRED EMBODIMENTS

Before the description of the preferred embodiments, prior art methods for manufacturing a DRAM cell will be explained with reference to FIGS. 1A through 1E, FIGS. 2A through 2E, and FIGS. 3A through 3E.

FIGS. 1A through 1E are cross-sectional views for explaining a first prior art method for manufacturing a DRAM cell (see: JP-A-3-139882).

Figure 1A:
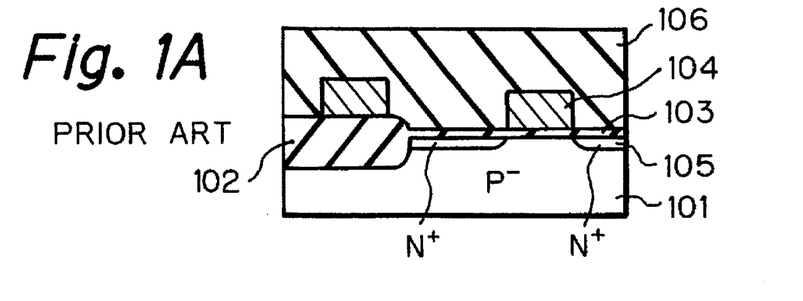
FIGS. 1A through 1E are cross-sectional views for explaining a first prior art method for manufacturing a capacitor.

First, referring to FIG. 1A, a $P^-$-type monocrystalline silicon substrate 101 is thermally oxidized by using a local oxidation of silicon (LOCOS) process to grow a field silicon oxide layer 102 thereon. Also, a gate silicon oxide layer 103 is formed by thermally oxidizing the silicon substrate 101. Then, a polycrystalline silicon layer 104 is formed by using a chemical vapor deposition (CVD) process, and is patterned to form word lines. Then, $N^+$-type impurity diffusion regions 105 are formed within the silicon substrate 101 in self-alignment with the polycrystalline silicon layer 104. Further, a boron-including phosphosilicate glass (BPSG) layer 106 is formed by using a CVD process.

Figure 1B:
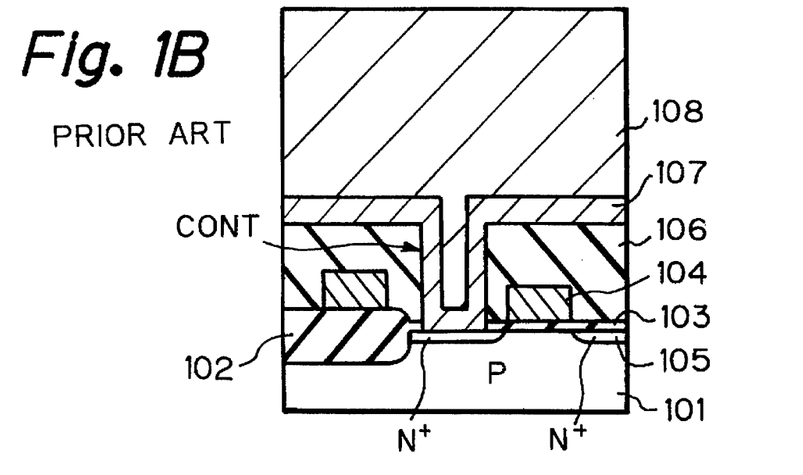

Next, referring to FIG. 1B, a contact hole CONT is perforated in the BPSG layer 106 by a photolithography and etching process. Then, a tungsten silicide layer 107 and a polycrystalline silicon layer 108 are formed on the BPSG layer 106. In this case, about $1 \times 10^{21}$ phosphorous ions/cm$^2$ are introduced into the polycrystalline silicon layer 108.

Figure 1C:
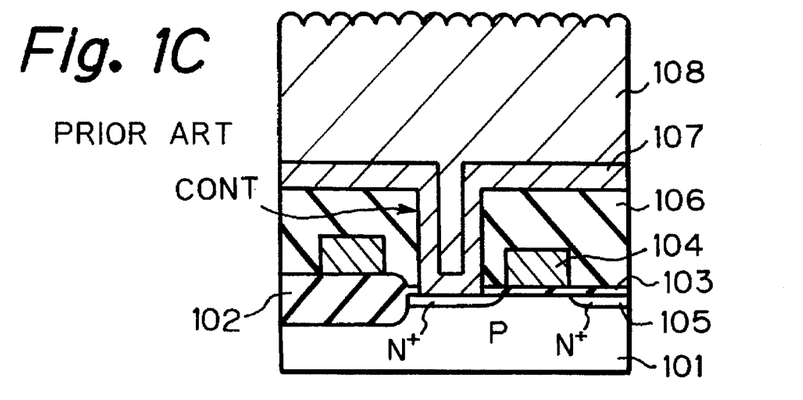

Next, referring to FIG. 1C, the device is immersed into hot phosphoric acid at a temperature of about 170° C. for a time of 10 to 20 minutes. Therefore, grain boundaries of the polycrystalline silicon layer 108 are etched so as to make the surface of the polycrystalline silicon layer 108 uneven. Note that the tungsten silicide layer 107 serves as an etching stopper for hot phosphoric acid, when the polycrystalline silicon layer 108 is thin.

Figure 1D:
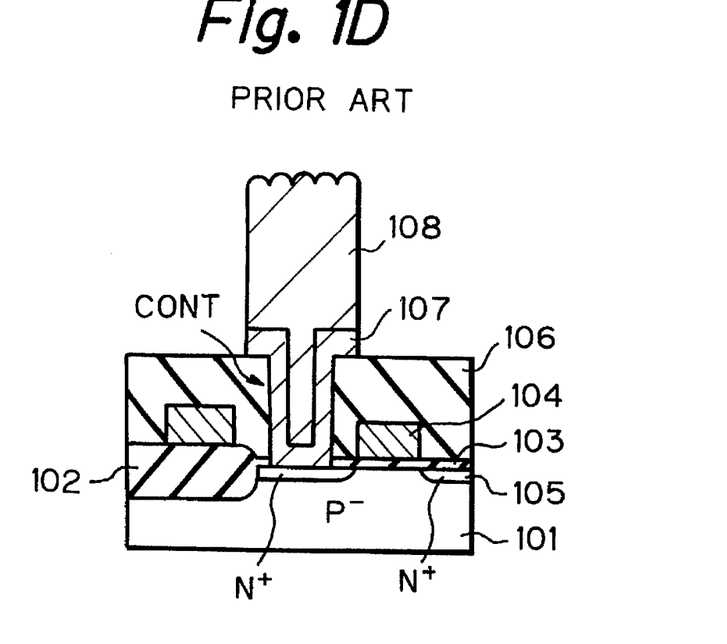

Next, referring to FIG. 1D, the polycrystalline silicon layer 108 and the tungsten silicide layer 107 are patterned to form a lower electrode layer.

Figure 1E:
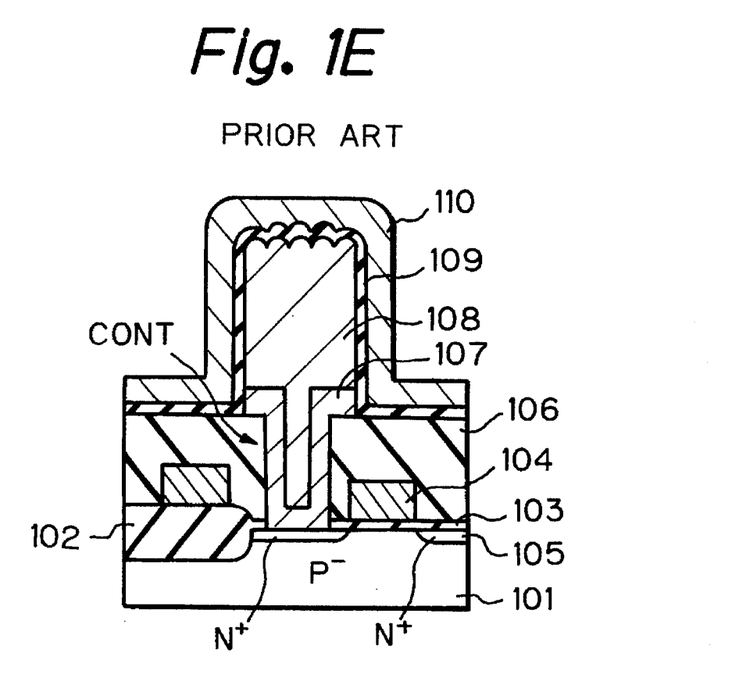

Finally, referring to FIG. 1E, a capacitor dielectric layer 109 and an upper electrode layer 110 are formed, to complete the cell.

Thus, the surface of the lower electrode layer (107, 108) and the surface of the upper electrode layer 110 are made uneven to increase the capacity of a stacked capacitor.

In the cell manufactured by the method as shown in FIGS. 1A through 1E, however, since the height of the polycrystalline silicon layer 108 is reduced by etching of hot phosphoric acid, the increase of the capacity of the stacked capacitor is reduced, and also, the capacity of the stacked capacitor fluctuates greatly. Also, in order to avoid disconnection of the polycrystalline silicon layer 106, a refractory metal silicide layer such as the tungsten silicide layer 107 is required. However, since the contact hole coverage characteristics of the refractory metal silicide layer are deteriorated as compared with polycrystalline silicon, the device is not adapted to a fine structure where the contact hole CONT is small in radius and large in height.

FIGS. 2A through 2E are cross-sectional views for explaining a second prior art method for manufacturing a DRAM cell.

Figure 2A:
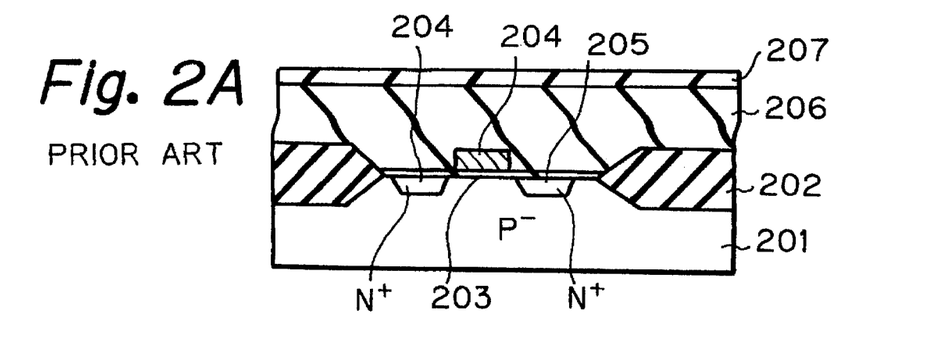
FIGS. 2A through 2E are cross-sectional views for explaining a second prior art method for manufacturing a capacitor.

First, referring to FIG. 2A, a P$^-$-type monocrystalline silicon substrate 201 is thermally oxidized by using a LOCOS process to grow a field silicon oxide layer 202 thereon. Also, a gate silicon oxide layer 203 is formed by thermally oxidizing the silicon substrate 201. Then, a polycrystalline silicon layer 204 is formed by using a CVD process, and is patterned to form word lines. Then, N$^+$-type impurity diffusion regions 206 are formed within the silicon substrate 201 in self-alignment with the polycrystalline silicon layer 204. Further, a BPSG layer 206 is formed by using a CVD process, and also, a high temperature silicon oxide (HTO) layer 207 is formed by using a high temperature CVD process.

Figure 2B:
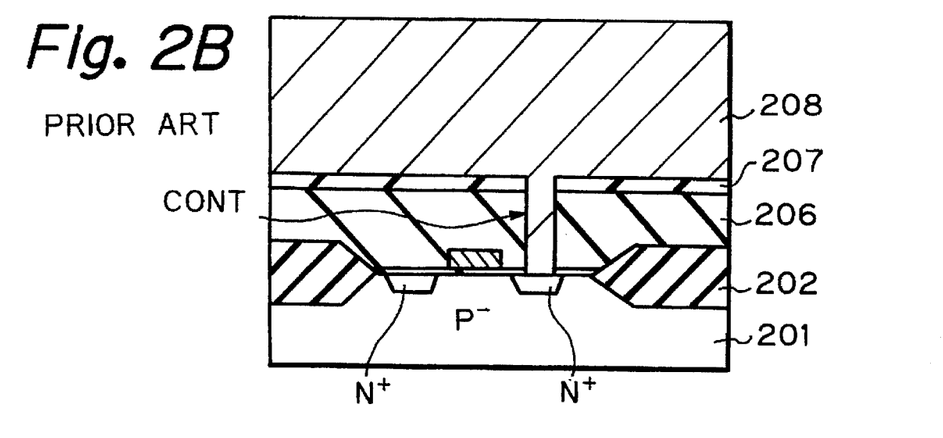

Next, referring to FIG. 2B, a contact hole CONT is perforated in the BPSG layer 206 and the HTO layer 207 by a photolithography and etching process. Then, a phosphorus-doped amorphous silicon layer 208 is deposited by using a low pressure CVD (LPCVD) process.

Figure 2C:
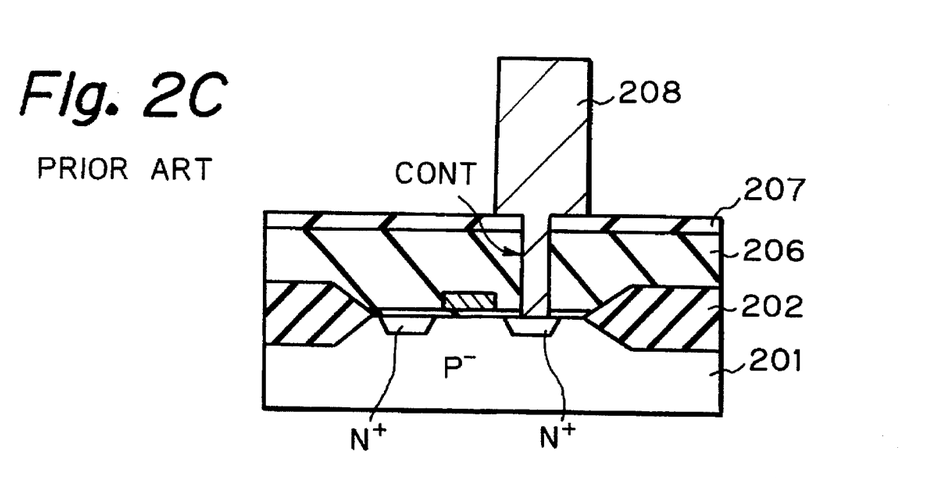

Next, referring to FIG. 2C, the amorphous silicon layer 208 is patterned by using a photolithography and etching process to form a lower electrode layer.

Figure 2D:
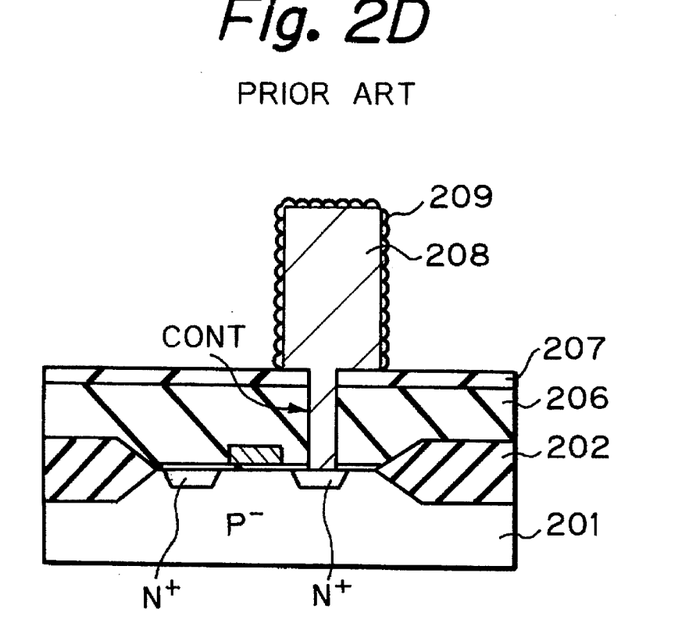

Next, referring to FIG. 2D, a seeding operation is performed upon the amorphous silicon layer 208, so that polycrystalline silicon is grown in the amorphous silicon layer 208, and thus, an HSG polycrystalline silicon layer 209 is formed thereon. That is, the device is put in an ultra-high vacuum chamber at a temperature of about 580° C. Then, molecules of Si$_2$H$_6$ are irradiated onto the device. Thus, polycrystalline silicon is grown in the amorphous silicon layer 208, and as a result, having an uneven surface is formed thereon to substantially increase the surface of the lower electrode of a stacked capacitor.

Figure 2E:
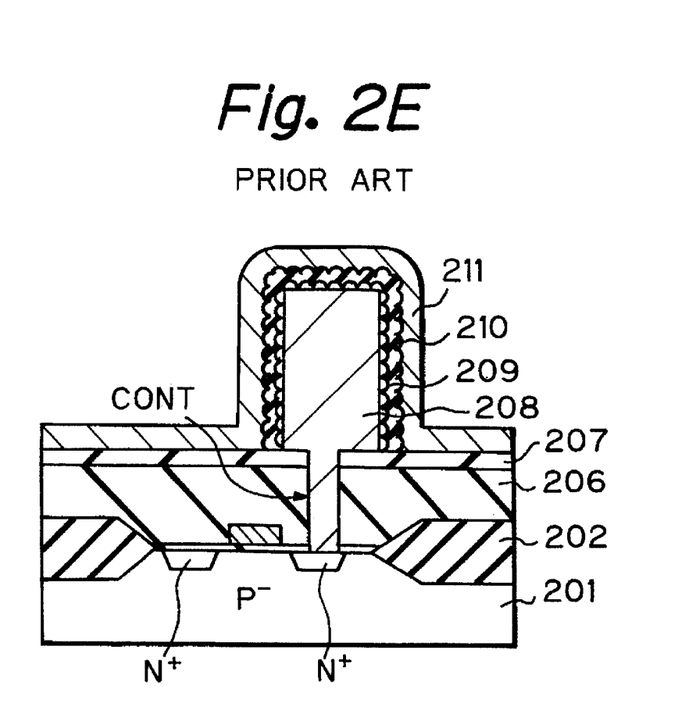

Finally, referring to FIG. 2E, a capacitor dielectric layer 210 and an upper electrode layer 211 are formed, to complete the cell.

Thus, the surface of the lower electrode layer 208 and the surface of the upper electrode layer 210 are made uneven to increase the capacity of the stacked capacitor.

In the cell manufactured by the method as shown in FIGS. 2A through 2E, however, a seeding apparatus with an ultra-high vacuum chamber is required which increases the manufacturing cost. Also, it is necessary to monitor a natural oxide layer on the amorphous silicon layer 208. That is, the HSG polycrystalline silicon layer 209 is grown by using a thermal migration phenomenon of silicon atoms. Therefore, if a natural oxide layer on the amorphous silicon layer 208 is completely removed before the forming of the HSG polycrystalline silicon layer 209, large hemispherical grains are formed. Contrary to this, if a natural oxide layer on the amorphous silicon layer 208 is incompletely removed before the forming of the HSG polycrystalline silicon layer 209, small hemispherical grains are formed. Such a monitoring operation also increases the manufacturing cost.

FIGS. 3A through 3E are cross-sectional views for explaining a third prior art method for manufacturing a DRAM cell (see: JP-A-4-152668).

Figure 3A:
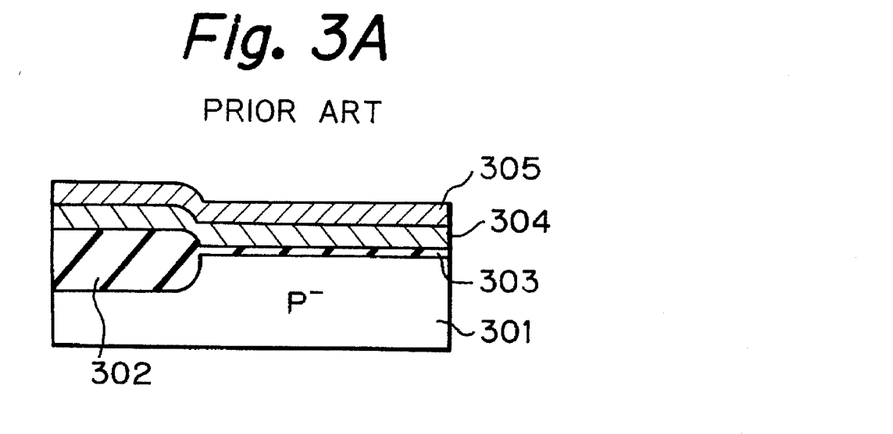
FIGS. 3A through 3E are cross-sectional views for explaining a third prior art method for manufacturing a capacitor.

First, referring to FIG. 3A, a P$^-$-type monocrystalline silicon substrate 301 is thermally oxidized by using a LOCOS process to grow a field silicon oxide layer 302 thereon. Also, a gate silicon oxide layer 303 is formed by thermally oxidizing the silicon substrate 301. Then, a polycrystalline silicon layer 304 is formed by using a CVD process, and then, N-type impurities are doped thereinto. Further, a tungsten silicide layer 305 is formed. In this tungsten silicide layer 305, the composition ratio of silicon to tungsten is not more than 2.2, that is, tungsten is rich.

Figure 3B:
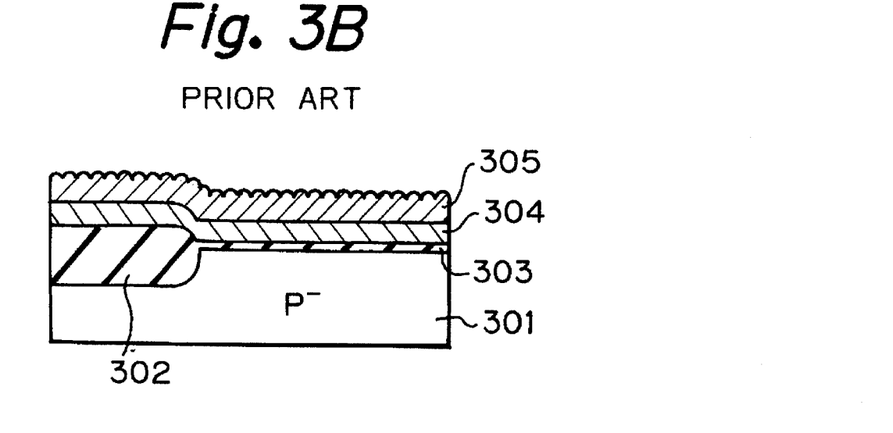

Next, referring to FIG. 3B, a heating operation at a temperature of about 900° C. is performed upon the device in an oxygen atmosphere for about 15 minutes. As a result, the surface of the tungsten silicide layer 305 is made uneven.

Figure 3C:
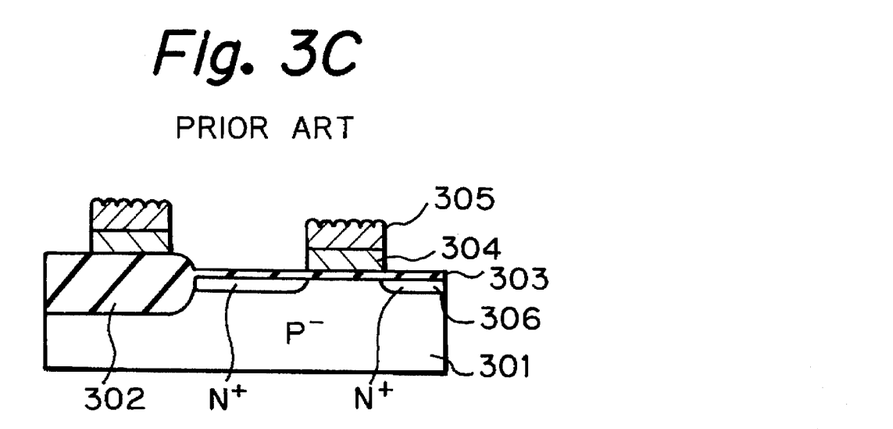

Next, referring to FIG. 3C, the tungsten silicide layer 305 and the polycrystalline silicon layer 304 are patterned to form word lines. Then, N$^+$-type impurity diffusion regions 306 are formed within the silicon substrate 301 in self-alignment with the word lines (304, 305). Further, a thin insulating layer 307 is formed.

Figure 3D:
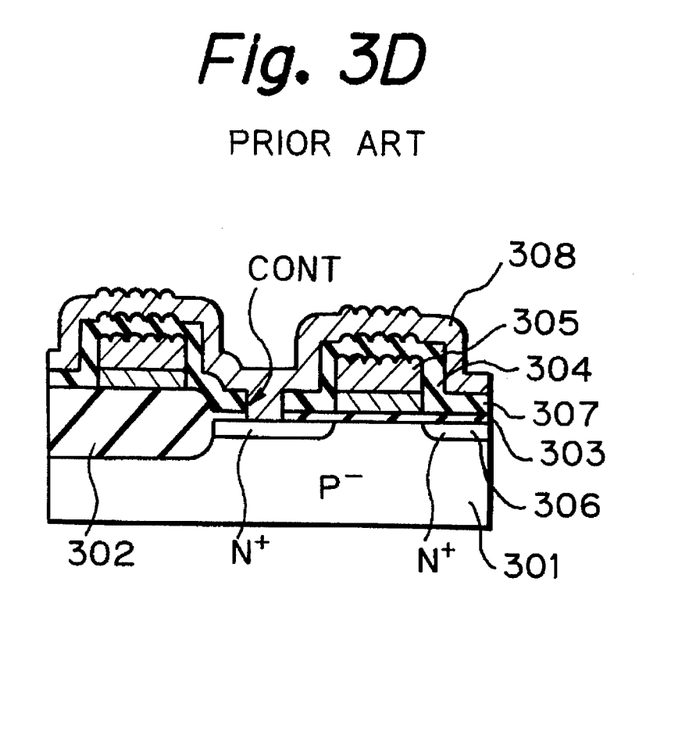

Next, referring to FIG. 3D, a contact hole CONT is perforated in the insulating layer 307 by a photolithography and etching process. Then, a polycrystalline silicon layer 308 is formed by using a CVD process, and the polycrystalline silicon layer 308 is patterned to form a lower electrode layer.

Figure 3E:
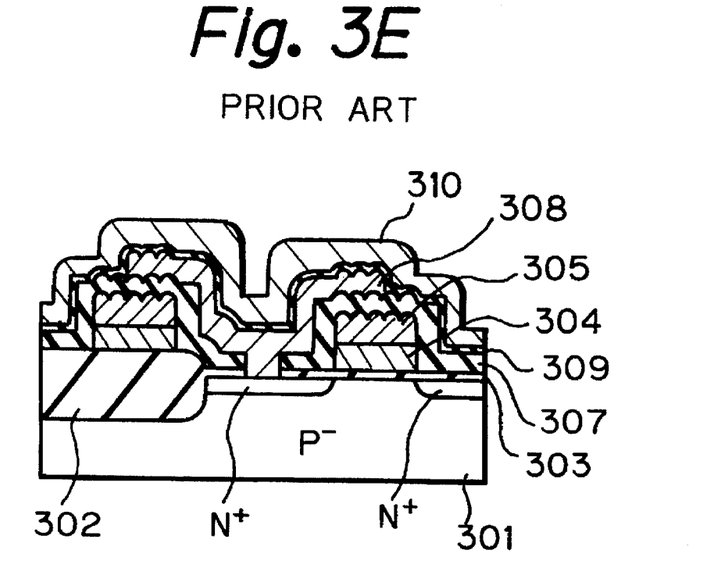

Finally, referring to FIG. 3E, a capacitor dielectric layer 309 and an uper electrode layer 310 are formed, to complete the cell.

Thus, the insulating layer 307 is so thin that the uneven surface of the tungsten silicide layer 305 is transferred to the surface of the polycrystalline silicon layer lower electrode 308. Thus, the surface of the polycrystalline silicon layer 308 is made uneven, to increase the capacity of a stacked capacitor.

In the cell manufactured by the method as shown in FIGS. 3A through 3E, however, since the insulating layer 307 is very thin, it is impossible to flatten the insulating layer 307, thus inviting disconnection of the layers 308 and 310 over the insulating layer 307. Also, when the tungsten silicide layer 305 is oxidized, tungsten may be peeled off from the tungsten silicide layer 305.

FIGS. 4A through 4G are cross-sectional views for explaining a first embodiment of the method for manufacturing a DRAM cell according to the present invention.

Figure 4A:
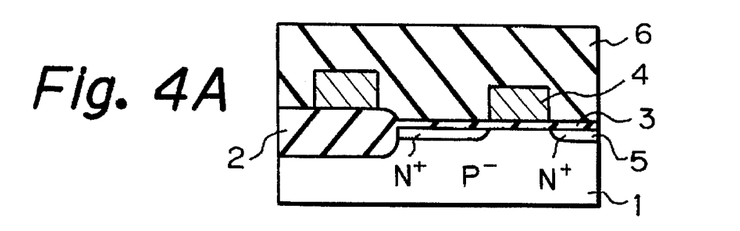
FIGS. 4A through 4G are cross-sectional views for explaining a first embodiment of the method for manufacturing a capacitor according to the present invention.

First, referring to FIG. 4A, a P$^-$-type monocrystalline silicon substrate 1 is thermally oxidized by using a LOCOS process to grow a field silicon oxide layer 2 thereon. Also, a gate silicon oxide layer 3 is formed by thermally oxidizing the silicon substrate 1. Then, a polycrystalline silicon layer 4 is formed by using a CVD process, and is patterned to form word lines. Then, N$^+$-type impurity diffusion regions 5 are formed within the silicon substrate 1 in self-alignment with the polycrystalline silicon layer 4. Further, a BPSG layer 6 is formed by using a CVD process.

Figure 4B:
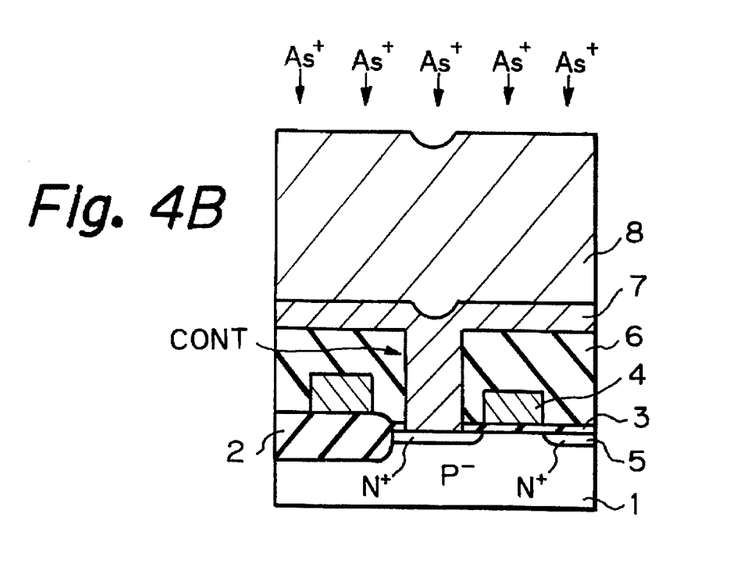

Next, referring to FIG. 4B, a contact hole CONT is perforated in the BPSG layer 6 by a photolithography and etching process. Then, a polycrystalline silicon layer 7 is deposited by a CVD process. Since the polycrystalline silicon layer 7 has good contact hole coverage characteristics, the polycrystalline silicon layer 7 is easily buried in the contact hole CONT even when the contact hole CONT is small in radius and large in height. Then, an about 1000 to 8000 Å thick amorphous tungsten silicide layer 8 is deposited at a substrate temperature of about 400° to 600° C. by using a sputtering process or a CVD process. In this case, in the amorphous tungsten silicide layer 8, the composition ratio of silicon to tungsten is about 2.2 to 3.0, that is, silicon is rich. Note that the silicon component of the amorphous tungsten silicide layer 8 has good contact characteristics to other materials. Then, $1 \times 10^{15}$ to $1 \times 10^{17}$ arsenic ions/cm$^2$ are doped into the amorphous tungsten silicide layer 8. Note that arsenic ions can be doped into the amorphous tungsten silicide layer 8 simultaneously with the formation of the amorphous tungsten silicide layer 8.

Figure 4C:
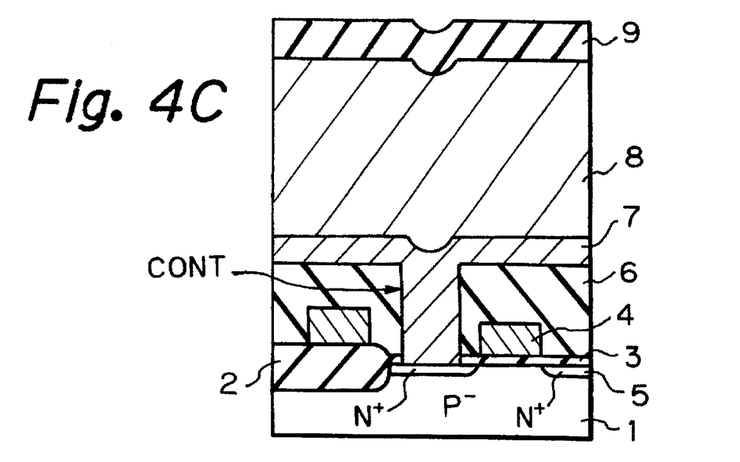

Next, referring to FIG. 4C, a cap silicon oxide layer 9 is deposited by using a CVD process at a low temperature of about 400° to 500° C. During the formation of the cap silicon oxide layer 9, the amorphous tungsten silicide layer 8 is hardly converted into crystal, since the substrate temperature is low.

Figure 4D:
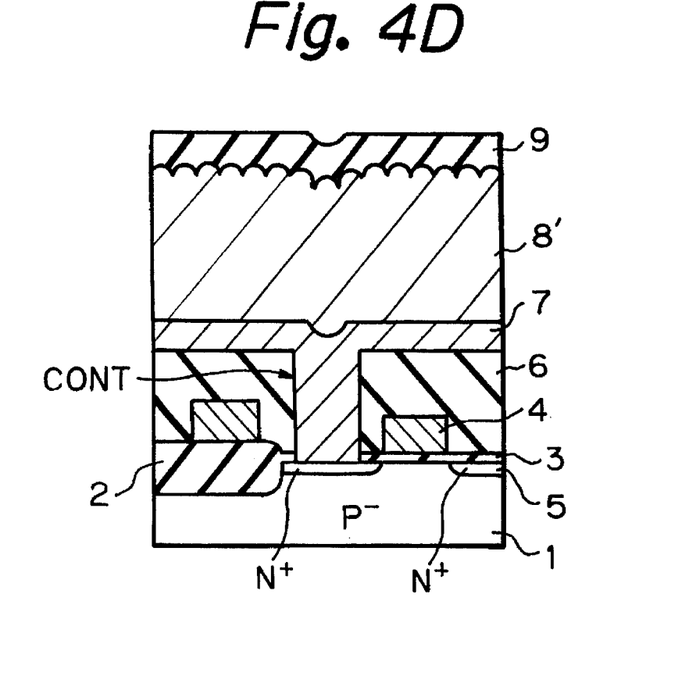

Next, referring to FIG. 4D, a heating operation at a temperature of about 800° to 900° C. is carried out in a nitrogen atmosphere for about 10 minutes. As a result, the amorphous tungsten silicide layer 8 is converted into a polycrystalline tungsten silicide layer 8'.

Figure 4E:
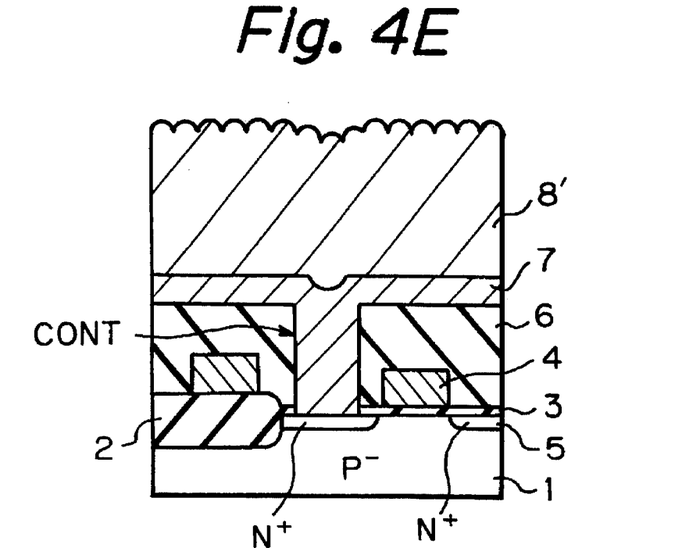

Next, referring to FIG. 4E, the cap silicon oxide layer 9 is etched by dilute fluoric acid. In this case, arsenic is already separated out of the polycrystalline tungsten silicide layer 8', and the separated arsenic is also removed from the grain boundaries of the polycrystalline tungsten silicide layer 8' by this etching. Thus, the unevenness degree of the surface of the polycrystalline tungsten silicide layer 8' becomes large.

Figure 4F:
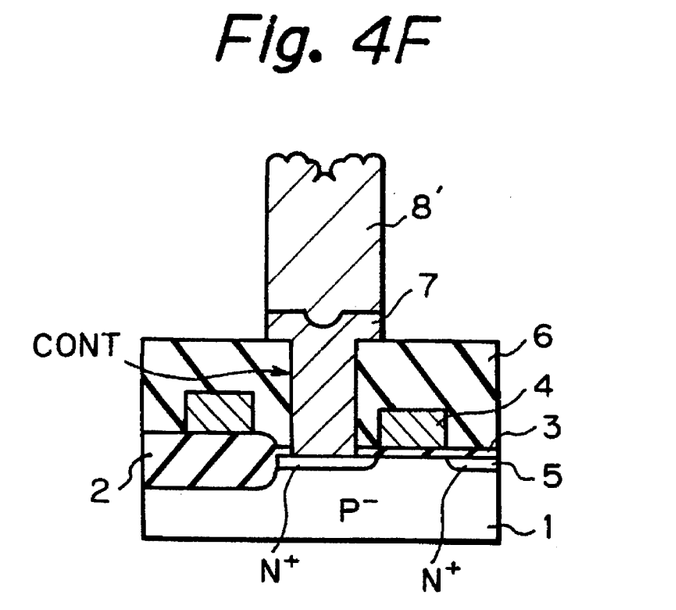

Next, referring to FIG. 4F, the polycrystalline tungsten silicide layer 8' and the polycrystalline silicon layer 7 are patterned to form a lower electrode layer.

Figure 4G:
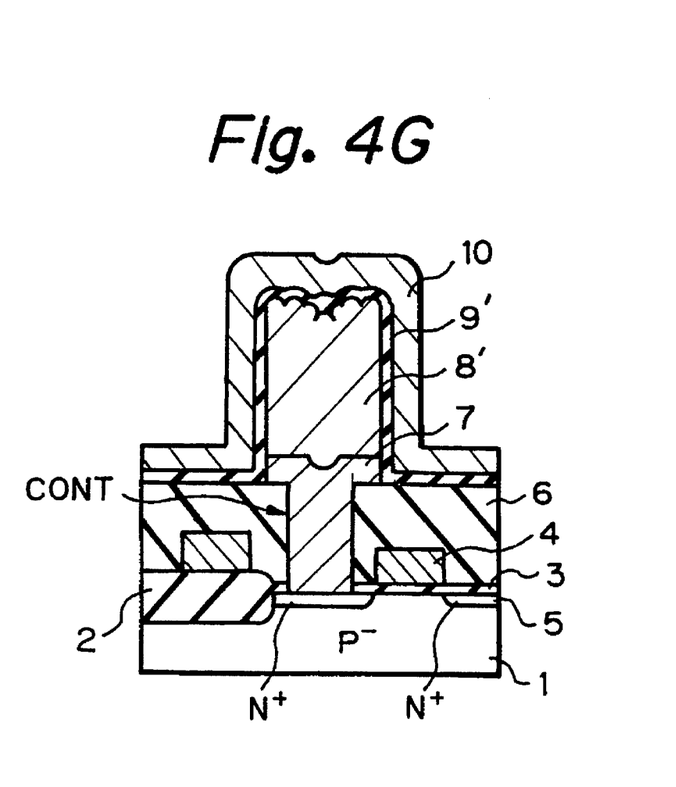

Finally, referring to FIG. 4G, a capacitor dielectric layer 9 and an upper electrode layer 10 are formed, to complete the cell.

Thus, the surface of the lower electrode layer 7, 8' and the surface of the upper electrode layer 10 are made uneven to increase the capacity of a stacked capacitor.

Figure 5:
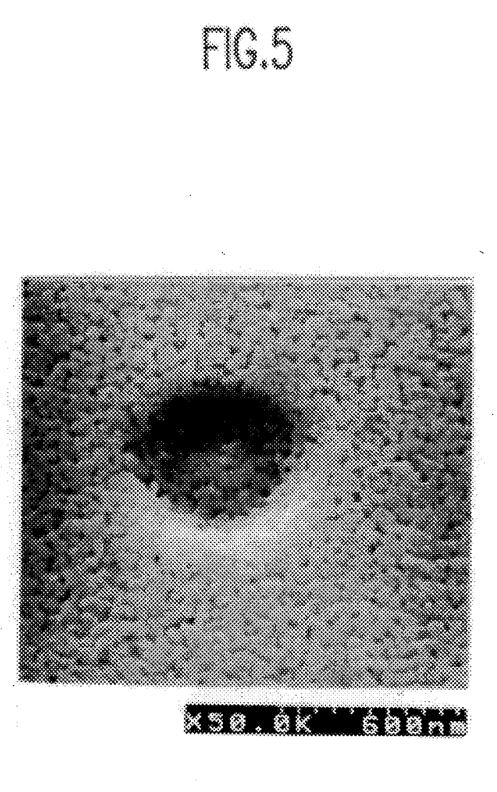
FIG. 5 is a photograph showing an example of the surface of the polycrystalline tungsten silicide layer of FIG. 4E.

As shown in FIG. 5, which shows an example of the surface of the polycrystalline tungsten silicide layer 8' of FIG. 4E, unevenness of about 100 to 500 Å is actually observed.

FIGS. 6A through 6G are cross-sectional views for explaining a second embodiment of the method for manufacturing a DRAM cell according to the present invention.

Figure 6A:
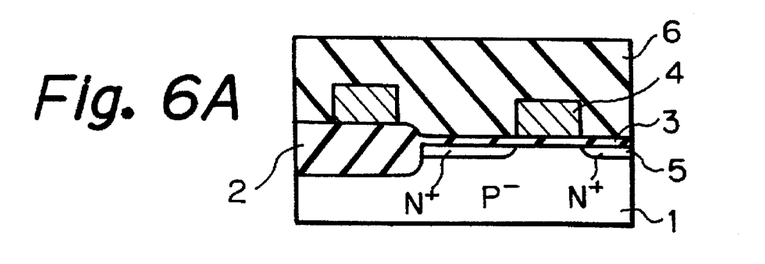
FIGS. 6A through 6G are cross-sectional views for explaining a second embodiment of the method for manufacturing a capacitor according to the present invention.

First, referring to FIG. 6A, in the same way as in FIG. 4A, a P$^-$-type monocrystalline silicon substrate 1 is thermally oxidized by using a LOCOS process to grow a field silicon oxide layer 2 thereon. Also, a gate silicon oxide layer 3 is formed by thermally oxidizing the silicon substrate 1. Then, a polycrystalline silicon layer 4 is formed by using a CVD process, and is patterned to form word lines. Then, N$^+$-type impurity diffusion regions 5 are formed within the silicon substrate 1 in self-alignment with the polycrystalline silicon layer 4. Further, a BPSG layer 6 is formed by using a CVD process.

Figure 6B:
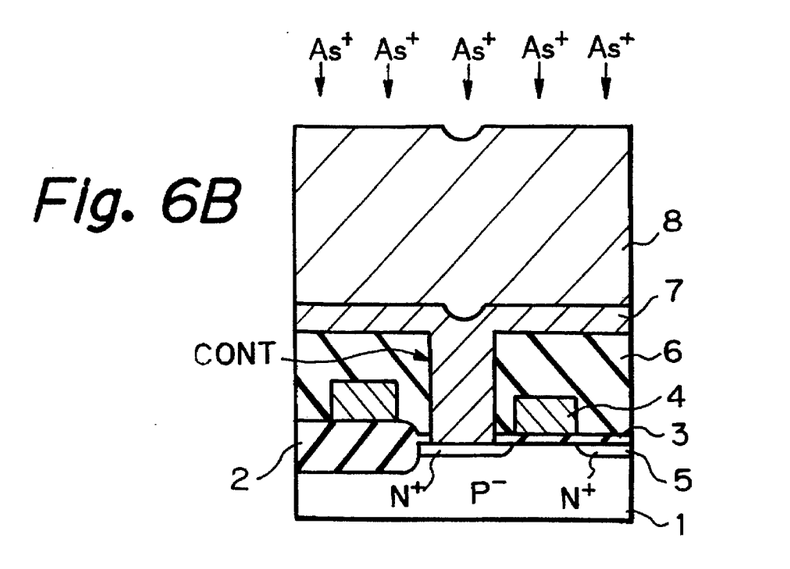

Next, referring to FIG. 6B, in the same way as in FIG. 4B, a contact hole CONT is perforated in the BPSG layer 6 by a photolithography and etching process. Then, a polycrystalline silicon layer 7 is deposited by a CVD process. Then, an about 1000 to 8000 Å thick amorphous tungsten silicide layer 8 is deposited at a substrate temperature of about 400° to 600° C. by using a sputtering process or a CVD process. Also, in this case, in the amorphous tungsten silicide layer 8, the composition ratio of silicon to tungsten is about 2.2 to 3.0, that is, silicon is rich. Then, $1 \times 10^{15}$ to $1 \times 10^{17}$ arsenic ions/cm$^2$ are doped into the amorphous tungsten silicide layer 8. Also, note that arsenic ions can be doped into the amorphous tungsten silicide layer 8 simultaneously with the formation of the amorphous tungsten silicide layer 8.

Figure 6C:
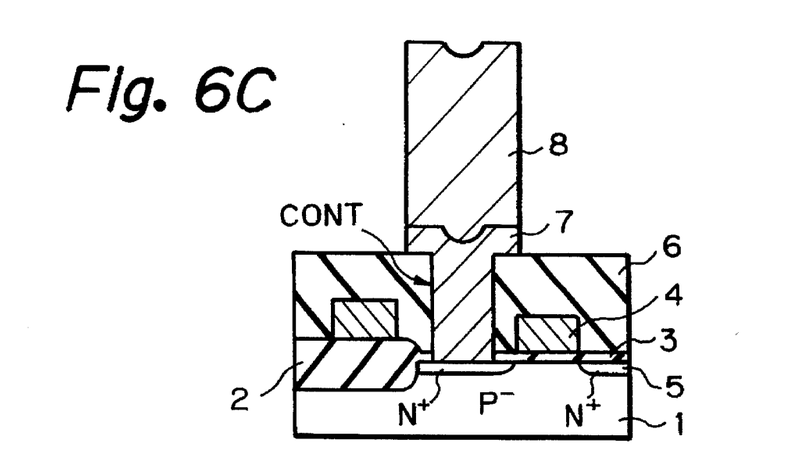

Next, referring to FIG. 6C, the amorphous tungsten silicide layer 8 and the polycrystalline silicon layer 7 are patterned to form a lower electrode layer.

Figure 6D:
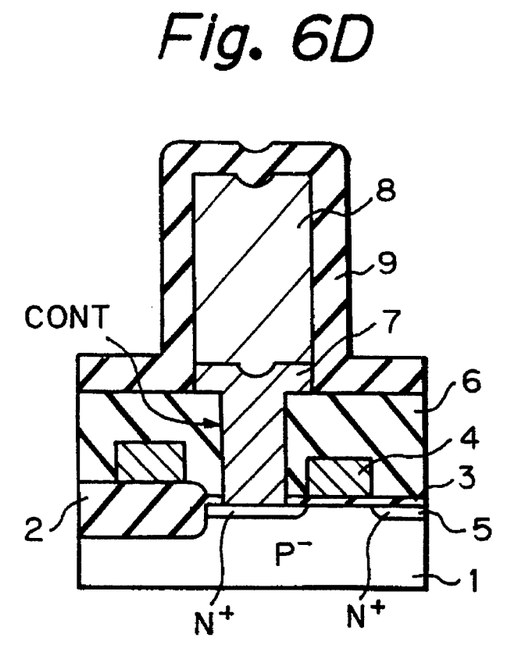

Next, referring to FIG. 6D, a cap silicon oxide layer 9 is deposited by using a CVD process at a low temperature of about 400° to 500° C. During the formation of the cap silicon oxide layer 9, the amorphous tungsten silicide layer 8 is hardly converted into crystal, since the substrate temperature is low.

Figure 6E:
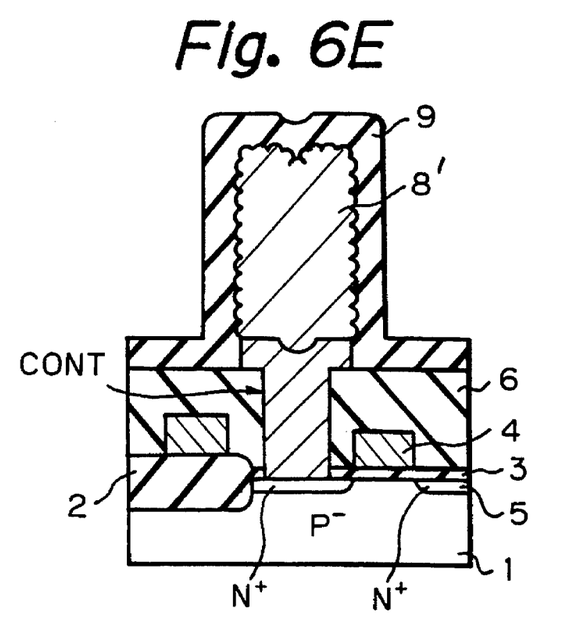

Next, referring to FIG. 6E, a heating operation at a temperature of about 800° to 900° C. is carried out in a nitrogen atmosphere for about 10 minutes. As a result, the amorphous tungsten silicide layer 8 is converted into a polycrystalline tungsten silicide layer 8'.

Figure 6F:
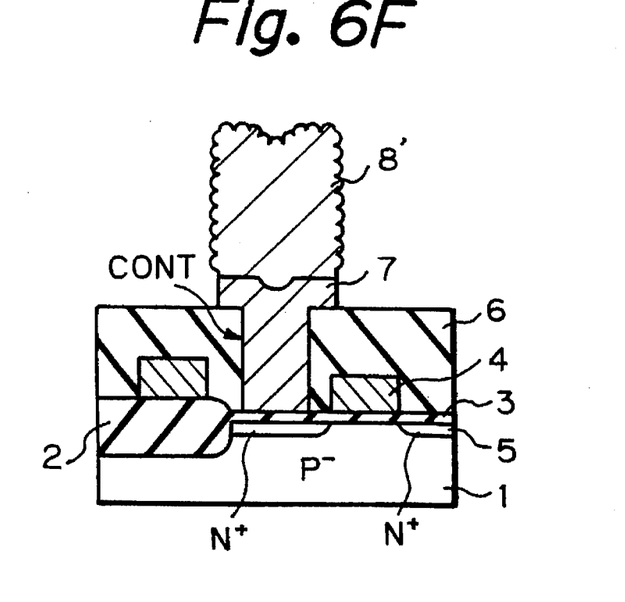

Next, referring to FIG. 6F, the cap silicon oxide layer 9 is etched by dilute fluoric acid. In this case, arsenic is already separated out of the polycrystalline tungsten silicide layer 8', and the separated arsenic is also removed from the grain boundaries of the polycrystalline tungsten silicide layer 8' by this etching. Thus, the unevenness degree of the surface of the polycrystalline tungsten silicide layer 8' becomes large.

Figure 6G:
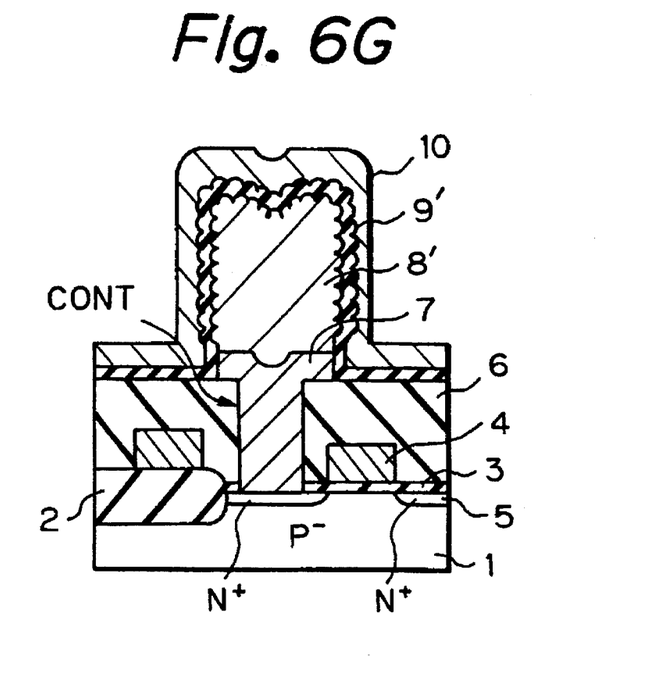

Finally, referring to FIG. 6G, a capacitor dielectric layer 9 and an upper electrode layer 10 are formed, to complete the cell.

Thus, the surface of the lower electrode layer 7, 8' and the surface of the upper electrode layer 10 are made uneven to increase the capacity of a stacked capacitor.

In the second embodiment, since the sidewall of the polycrystalline tungsten silicide layer 8' is also made uneven, the capacity of the stacked capacitor can be increased as compared with the first embodiment.

In the above-described embodiments, the tungsten silicide layers 8 and 8' are used; however, other refractory metal silicide layers can be used.

As explained hereinbefore, according to the present invention, since unevenness of the surface of a lower electrode is obtained by converting amorphous refractory metal silicide into polycrystalline refractory metal silicide, a highly-integrated capacitor can be obtained at a low manufacturing cost.

I claim:

1. A method for manufacturing a capacitor, comprising the steps of:

forming an insulating layer on a semiconductor substrate;

perforating a contact hole in said insulating layer;

burying an underlying conductive layer in said contact hole;

forming an amorphous refractory metal silicide layer with an impurity on said underlying conductive layer;

performing a heating operation upon said amorphous refractory metal silicide layer, so that said amorphous refractory metal silicide layer is converted into a polycrystalline refractory metal silicide layer;

patterning said polycrystalline refractory metal silicide layer and said underlying conductive layer to form a lower electrode;

forming a dielectric layer on said lower electrode; and forming an upper electrode.

2. The method as set forth in claim 1, further comprising the steps of:

forming a silicon oxide layer on said amorphous refractory metal silicide layer without converting said amorphous refractory metal silicide layer into polycrystal; and removing said silicon oxide layer after said heating operation is performed.

3. The method as set forth in claim 1, wherein said heating operation is performed in a nitrogen atmosphere at a temperature of about 800° to 900° C.

4. The method as set forth in claim 1, wherein said underlying conductive layer is made of polycrystalline silicon, and said amorphous refractory metal silicide layer is made of tungsten silicide.

5. The method as set forth in claim 4, wherein the impurity of said amorphous refractory metal silicide layer is arsenic.

6. The method as set forth in claim 4, wherein said tungsten silicide has a compositon ratio of silicon to tungsten of approximately 2.2 to 3.0.

7. A method for manufacturing a capacitor, comprising the steps of:

forming an insulating layer on a semiconductor substrate;

perforating a contact hole in said insulating layer;

burying an underlying conductive layer in said contact hole;

forming an amorphous refractory metal silicide layer with an impurity on said underlying conductive layer;

patterning said amorphous refractory metal silicide layer and said underlying conductive layer to form a lower electrode;

performing a heating operation upon said amorphous refractory metal silicide layer, so that said amorphous refractory metal silicide layer is converted into a polycrystalline refractory metal silicide layer;

forming a dielectric layer on said lower electrode; and forming an upper electrode.

8. The method as set forth in claim 7, further comprising the steps of:

forming a silicon oxide layer on said amorphous refractory metal silicide layer without converting said amorphous refractory metal silicide layer into polycrystal, after said lower electrode is formed; and removing said silicon oxide layer after said heating operation is performed.

9. The method as set forth in claim 7, wherein said heating operation is performed in a nitrogen atmosphere at a temperature of about 800° to 900° C.

10. The method as set forth in claim 7, wherein said underlying conductive layer is made of polycrystalline silicon, and said amorphous refractory metal silicide layer is made of tungsten silicide.

11. The method as set forth in claim 10, wherein the impurity of said amorphous refractory metal silicide layer is arsenic.

12. The method as set forth in claim 10, wherein said tungsten silicide has a compositon ratio of silicon to tungsten of approximately 2.2 to 3.0.

* * * * *